(12) United States Patent
Gies

(10) Patent No.: US 9,121,092 B2
(45) Date of Patent: Sep. 1, 2015

(54) TRIBOLOGY COMBINED WITH CORROSION RESISTANCE: A NEW FAMILY OF PVD- AND PACVD COATINGS

(75) Inventor: Astrid Gies, Haldenstein (CH)

(73) Assignee: OERLIKON SURFACE SOLUTIONS AG, TRUBBACH, Trubbach (CH)

( * ) Notice: Subject to any disclaimer, the term of this patent is extended or adjusted under 35 U.S.C. 154(b) by 476 days.

(21) Appl. No.: 13/389,091

(22) PCT Filed: Aug. 4, 2010

(86) PCT No.: PCT/CH2010/000192
§ 371 (c)(1),
(2), (4) Date: Mar. 14, 2012

(87) PCT Pub. No.: WO2011/014974
PCT Pub. Date: Feb. 10, 2011

(65) Prior Publication Data
US 2012/0161156 A1 Jun. 28, 2012

Related U.S. Application Data

(60) Provisional application No. 61/232,137, filed on Aug. 7, 2009.

(51) Int. Cl.
*H01L 29/161* (2006.01)
*H01L 21/04* (2006.01)
*C23C 14/06* (2006.01)
*C23C 14/02* (2006.01)
*C23C 14/58* (2006.01)
*C23C 28/00* (2006.01)

(52) U.S. Cl.
CPC ............ *C23C 14/0605* (2013.01); *C23C 14/025* (2013.01); *C23C 14/584* (2013.01); *C23C 28/322* (2013.01); *C23C 28/34* (2013.01); *C23C 28/341* (2013.01); *C23C 28/343* (2013.01); *C23C 28/347* (2013.01); *C23C 28/36* (2013.01)

(58) Field of Classification Search
None
See application file for complete search history.

(56) References Cited

U.S. PATENT DOCUMENTS

| 5,540,957 A | 7/1996 | Ueda et al. | |
| 2004/0038033 A1* | 2/2004 | Massler et al. | 428/408 |
| 2004/0223256 A1* | 11/2004 | Feng et al. | 360/122 |
| 2007/0042154 A1* | 2/2007 | Hancer et al. | 428/64.1 |
| 2007/0231472 A1* | 10/2007 | Liu et al. | 427/128 |

FOREIGN PATENT DOCUMENTS

GB    2455993 A    7/2009

OTHER PUBLICATIONS

Drees, et al., "The Electrochemical and Wear Behavior of Amorphous Diamond-like Carbon Coatings and Multilayered Coatings in Aqueous Environments" Surface and Coatings Technology, vol. 86-87, 1996, pp. 575-580.

* cited by examiner

*Primary Examiner* — David Sample
(74) *Attorney, Agent, or Firm* — Pearne & Gordon LLP

(57) ABSTRACT

The present invention relates to a coating system on a substrate with improved protection against wear as well as corrosion. According to the invention the substrate is coated with a diamond like carbon (DLC) layer. This DLC layer is coated with an additional layer with material different from the DLC coating material, thereby closing the pin holes of the DLC layer.

7 Claims, 2 Drawing Sheets

TRIBOLOGY COMBINED WITH CORROSION RESISTANCE: A NEW FAMILY OF PVD- AND PACVD COATINGS

The present invention relates to coatings formed by physical vapour deposition and/or plasma assisted chemical vapour deposition with good tribological properties and improved corrosion resistance as compared to prior art solutions. PVD and PACVD-coatings are known to provide for excellent tribological properties and are widely used as for example wear resistant coatings for tools.

However due to the coating process it is nearly impossible to avoid pinholes, resulting in poor corrosion resistance. The pinholes result either from the thin film morphology (grain boundaries etc.) or from the thin film growth (defects rising up from the coating deposition). Therefore for many coating materials it is nearly impossible to avoid pinholes when PVD and/or PACVD techniques are used. Corrosion is especially in areospace applications an issue as the respective components such as for example turbines are exposed to harsh environmental conditions and are difficult and therefore expensive to replace.

It is one objective of the present invention to provide a method for producing PVD- and/or PACVD-coatings, the coatings having good tribological properties and excellent corrosion resistance.

In many cases pinholes extend throughout the coating from the substrate 1 to the surface of the coating (through-pinholes). According to the present invention measures are taken in order to avoid especially these through-pinholes. It was surprising to see that the corrosion resistance was dramatically increased when these through-pinholes are avoided. Coatings produced according to the present invention show a corrosion resistance of more than 150 h in salt spray test (EN ISO 9227:2006) as compared to about 30 h for standard coatings.

Note that according to the present invention pinholes are not avoided and the number is not necessarily decreased, however measures are taken to avoid the special class of through-pinholes which extend from the substrate side of the coating to the surface side of the coating.

Figure 1:
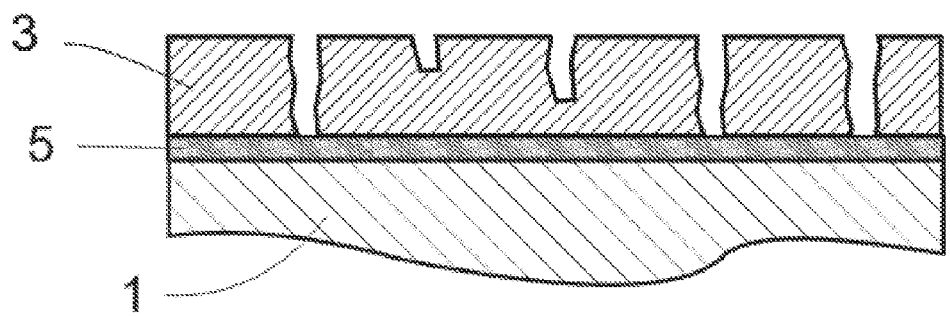
FIG. 1 shows a substrate with a corrosion resistance layer.

According to a first embodiment of the present invention, shown in FIG. 1 the pinholes are sealed by integrating in addition a corrosion resistance providing layer 5 beneath and/or in and/or on top of the functional coating system. For this, one has to choose a dense and insulating material which may be applied with reduced number of pinholes and preferably with no pinholes.

Our development has focussed on the following materials:
a. Si-based coatings (sputtered from a Si-containing target or deposited by PACVD using a Si-containing precursor)
b. different nitrides of metals (ex.: aluminium nitride or silicon nitride)
c. different oxides of metals (ex.: aluminium oxide or silicon oxide)

Figure 2:
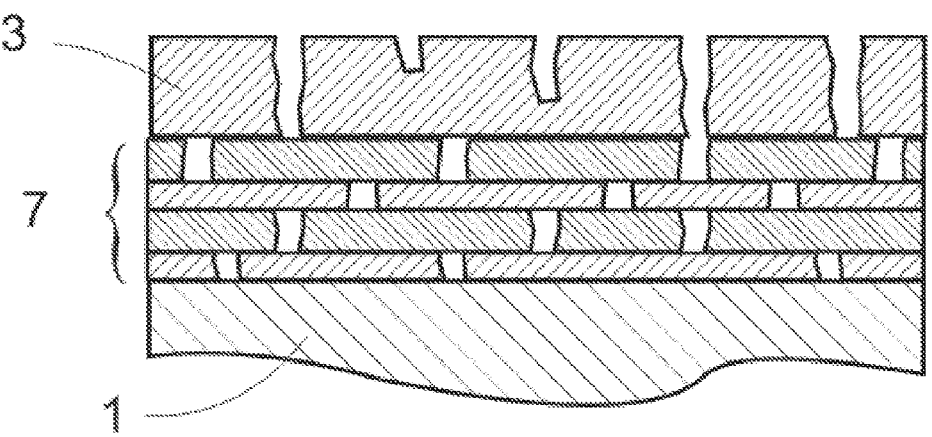
FIG. 2 shows a substrate coated with a multilayer system.
Figure 3:
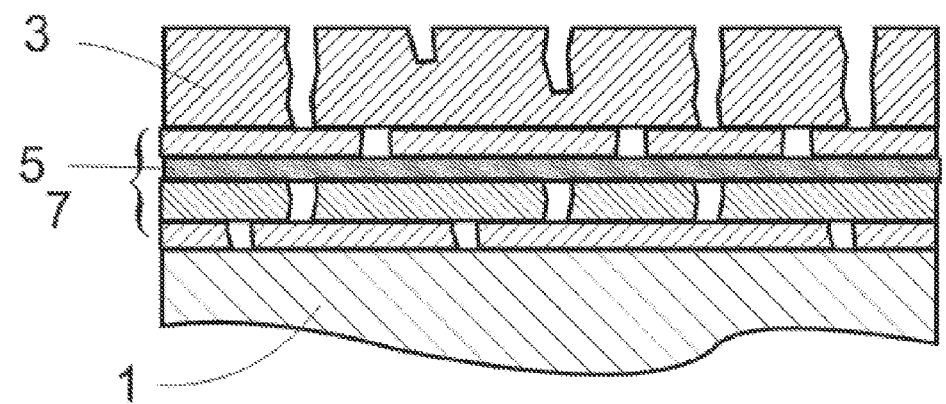
FIG. 3 shows a substrate with a multilayer system including a corrosion resistance layer.

According to a second embodiment of the present invention a multilayer system 7 with discontinuous pinholes is integrated. This is shown in FIG. 2. This can be achieved by using multilayers were the different single layers show significantly different morphologies and therefore lead to a discontinuous growth of pinholes within the multilayer system.

For example the following materials can be combined to build up such a multilayer system:
d. Cr, CrN
e. Ti, TiN
f. Al, AlN
g. carbon based coatings
h. silicon based coatings In their paper D. Pech, et al., Duplex SiCN/DLC coating as a solution to improve fretting—Corrosion resistance of steel, Wear (2009), doi:10.1016/j.wear.2008.12.007, the authors use a SiCN layer between the substrate and the DLC layer in order to improve adhesion of the DLC layer to the substrate as well as in order to improve the corrosion resistance of the steel.

It is the object of the present invention to further improve the corrosion resistance of a substrate without jeopardizing the wear resistance of the coated surface.

This object may be met by providing onto a DLC layer a top layer formed by Si—C—H, Si—C—N, or Si—C—H—N or a combination thereof.

In the following the invention will be described in detail with the help of different embodiments.

The present examples relate to diamond like carbon (DLC) layers, which are used to explain and demonstrate the effect of the present invention. However this is not thought to limit the scope of the invention to DLC layers. The one skilled in the art will know how to transfer the teaching of the following examples to other layer systems.

According to a first embodiment of the present invention, a Si—C—H layer is formed on top a DLC layer. The main process steps of coating such a DLC layer will be described in the following. For more detailed description of how to produce such layers the reader is referred to US 20080292812 A1, which is incorporated by reference to this description.

The substrates were piston pins made of 17Cr3, a steel material. The notation is known by the one skilled in the art.

The deposition was carried out on a installation by OC Oerlikon Balzers AG. This is a vacuum treatment installation with a vacuum chamber in which a device for generating an electric low voltage arc discharge (NVBE) comprised of a cathode and an anode, electrically interconnectable with the cathode via an arc generator is used, whereby at least portion of the surface of the anode is fabricated of graphite and is heated to a certain temperature in order to avoid deposition of material on the anode. An ion and/or electron source, in particular a low voltage arc discharge cathode is installed in the proximity of the installation axis and connected to an output of an arc generator. A disc formed of graphite material is installed as well in proximity of the installation axis, however at the opposite wall of the chamber as compared to the cathode, said disc forming a low voltage arc anode. During operation near to the axis of the chamber a low volt arc is established between cathode and anode.

Foreseen is as well a gas feed, which allows to introduce gases such as Tetramethylsilan ($Si(CH_3)_4$) in the following referred to as TMS, which forms a Si-containing precursor which is often used in DLC coating processes in order to dope DLC-layers with Si.

After inserting the work pieces into the chamber, the chamber is pumped down to a pressure if approximately $10^{-4}$ mbar. After setting the process temperature and performing an etching step in order to clean the surface of the substrate, a chromium layer of approximately 0.6 µm is coated onto the substrate to increase adhesion between the substrate and the DLC layer to be subsequently coated. In the next coating step a coating of the substrate with a DLC layer is carried out. For this coating the low voltage arc is operated with an $C_2H_2$ flow of 120 sccm, an argon flow of 100 sccm, a process pressure of 0.36 Pa, a substrate voltage of −800 V at a deposition temperature if approximately 290° C. and for a deposition length of 90 minutes. By this a DLC layer of approximately 2.2 µm is deposited.

On top of this DLC layer and according to the present invention as an outer layer a Si—C—H layer with 0.8 µm thickness is deposited by using the following coating parameters: A TMS flow of 120 sccm was used with a substrate voltage of −600 V during a deposition time of 60 minutes. During that deposition no arc was burning. By this an Si—C—H layer was formed which adhered to the underlying DLC layer by forming covalent bindings between the C-atoms.

In addition to further improve the above described layer system, an interlayer between the substrate or the chromium layer and the DLC layer can be provided, which significantly improves the adherence of the DLC layer to the substrate or the chromium layer if given. Any other suitable adhesion layer material such as Cr—C, Si—C—H, Cr—Si, CrN or the combination of those may be used as adhesion layer. Preferably a DLC interlayer is formed as a gradient layer onto the adhesion layer which means that adhesion material concentration decreases while DLC material concentration increases at the same time. This may be continuously as well as stepwise.

Figure 4:
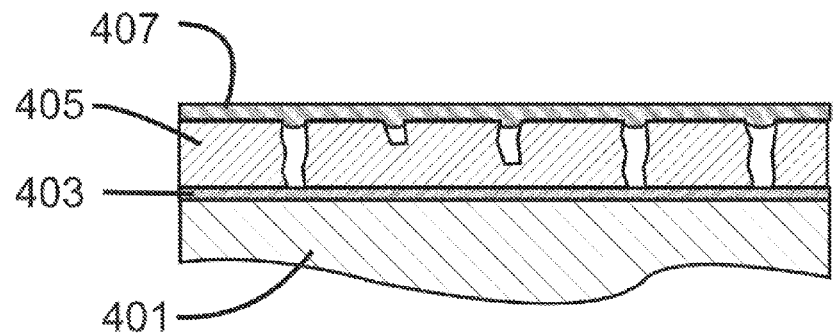
FIG. 4 shows a layer system with an interlayer.

FIG. 4 shows schematically the setup of the layer system according to this embodiment of the present invention. Shown is the substrate 401, covered by a 0.6 µm thick chromium layer 403 and a 2.2 µm thick DLC-layer 405. On top of this DLC layer there is a 0.8 µm thick Si—C—H layer 407.

This inventive layer was tested with the so called Pin-on-disc-test as described following. Within this test an uncoated steel sphere is pressed onto a rotating disc which is coated with the coating to be tested. The sphere is pressed onto the disc with an applied load of 30N, allowing to measure the coefficient of friction and to analyse the wear track of the coating and the counter body wear. The measurements of the inventive coatings were compared to DLC-coatings without outer Si—C—H layer.

Figure 5:
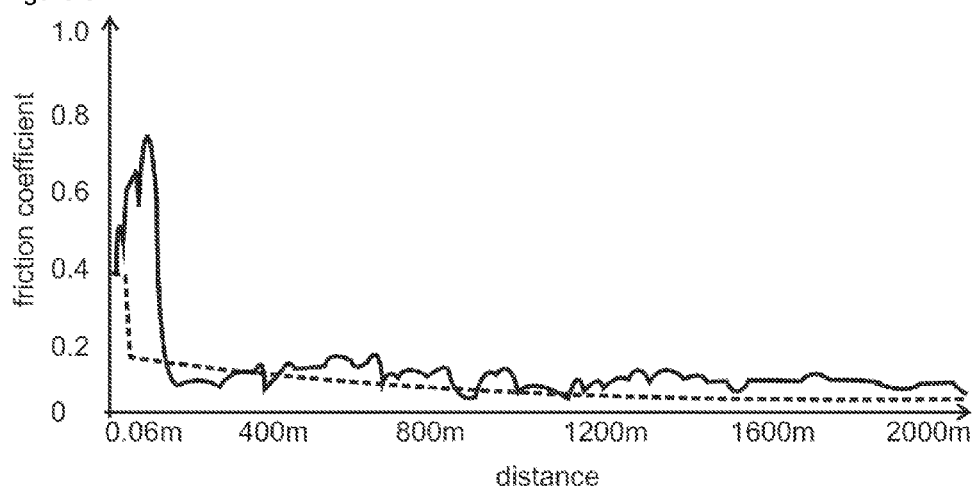
FIG. 5 shows the friction coefficient as a function of running distance.

FIG. 5 shows the friction coefficient as a function of running distance for the standard DLC coating as broken line and the inventive DLC-SiCH combination as continuous line. It was not very surprising that the running in characteristics of the inventive layer system turned out to be slightly worse as compared to the standard DLC-layer. As can be seen from the figure the friction coefficient of the inventive coating seems to be slightly above the friction coefficient of the standard DLC coating. However this might be due to measurement incertainities. As can be seen the measured cover of the inventive coating shows a significant noise level. Very surprising however was the fact that the wear against a counter body with 0.62 µm showed to be much less for the inventive coating as compared to the standard DLC coating, which turned out to be 0.99 µm.

Figure 6:
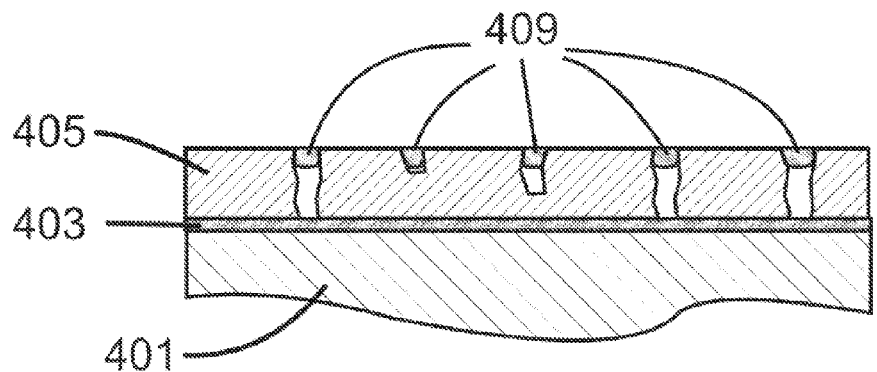
FIG. 6 shows Si-C-H material in pin holes of a DLC layer.

One possible explanation for this surprising effect could be that the Si—C—H material is pressed into the pin holes of the DLC layer during the running in phase and remains there whereas the other parts of the SiCH layer are removed. This situation is shown schematically in FIG. 6, indicating the at least partially filled pinholes 409. Due to the smoothness provided by this Si—C—H coating, the counter body does no more experience the hard edges formed by the pinholes of the DLC containing layer as they are at least partially filled with Si—C—H material, thereby decreasing the wear of the counter body significantly.

Apart from piston pins the inventor tested forked pipes, shafts and spindles, as well as damper tubes and parts of watches. For all of these applications the coating according to the embodiment as discussed showed improved characteristics with respect to corrosion while the wear resistant properties improved or remained the same.

Disclosed is a substrate comprising a diamond like carbon containing (DLC) layer, covering at least partially the substrate surface, characterised in that at least some of the pin holes, preferably most of the pin holes of the DLC containing layer are closed by at least one material different from the DLC containing layer.

Said substrate may be characterised in that the at least one material comprises Si and that, if the DLC containing layer comprises Si itself and therefore in locations other than pinholes, the Si-concentration within the at least some pin holes of the DLC containing layer is above the average Si concentration within the DLC containing layer.

At least one material may over the diamond like carbon containing layer, thereby closing the pin holes.

The at least one material may be one or a combination of the elements of the group consisting of Si—C—H, Si—C—N, Si—C—H—N, however preferably Si—C—H.

An adhesion layer may be foreseen between the DLC containing layer and the substrate, the adhesion layer material preferably being a material selected from the group consisting of chrome, Cr—C, Si—C—H, Cr—Si and Cr—N or the combination of two or more thereof.

Between the DLC layer and the substrate an interlayer may be foreseen with DLC material concentration preferably increasing in form of a gradient layer, most preferably continuous or stepwise.

Disclosed is as well a method for producing a wear resistant and corrosion resistant surface on a substrate, said method comprising the following steps:

providing a substrate, coating said substrate with a diamond like carbon (DLC) containing layer, said DLC containing layer comprising pin holes closing at least some, preferably most, most preferably essentially all pin holes of the DLC containing layer by a coating layer with coating material different from the material forming the DLC containing layer.

The method may comprise a step during which previous to coating a DLC containing layer, the surface is coated with an adhesion layer, said adhesion layer being preferably a chromium layer.

REFERENCES

1 Substrate
2 Functional coating system
3 Corrosion resistance providing layer
7 Multilayer system
401 Substrate
403 Chromium layer
405 DLC layer
407 Si—C—H layer

The invention claimed is:

1. A substrate, comprising:
    a diamond-like carbon (DLC) containing layer with a plurality of pin holes, covering at least partially the substrate's surface,
    wherein at least some of the pin holes present in the DLC containing layer are closed by at least one material that is different than the DLC containing layer, the at least one material is one selected from the group consisting of Si—C—H, Si—C—N, and Si—C—H—N, and
    wherein an adhesion layer is disposed between the DLC containing layer and the substrate, the adhesion layer being one or more materials selected from the group consisting of Cr, Cr—C, Si—C—H, Cr—Si, and Cr—N.

2. The substrate according to claim 1, wherein the at least one material comprises Si, and
    wherein, if the DLC containing layer comprises Si in locations other than the pin holes, a Si-concentration within the at least some of the pin holes of the DLC containing layer is above an average Si-concentration within the DLC containing layer.

3. The substrate according to claim 1 or 2, wherein the at least one material covers the DLC containing layer, thereby closing the pin holes.

4. The substrate according to claim 1 or 2, wherein, between the DLC layer and the substrate, an interlayer is disposed with a DLC material concentration increasing continuously in a form of a gradient layer.

5. The substrate according to claim 1 or 2, wherein the at least one material is Si—C—H.

6. The substrate according to claim 1 or 2, wherein, between the DLC layer and the substrate, an interlayer is disposed with a DLC material concentration increasing stepwise in a form of a gradient layer.

7. A multi-layer structure for a substrate, comprising:
    an adhesion layer positioned on the substrate, the adhesion layer being one or more materials selected from the group consisting of Cr, Cr—C, Si—C—H, Cr—Si, and Cr—N;
    a diamond-like carbon (DLC) containing layer positioned on the adhesion layer and at least partially covering a surface of the substrate, the DLC containing layer comprising a plurality of pin holes; and
    a coating layer closing one or more of the pin holes, the coating layer being one or more materials from the group consisting of Si—C—H, Si—C—N, and Si—C—H—N.

* * * * *

UNITED STATES PATENT AND TRADEMARK OFFICE
CERTIFICATE OF CORRECTION

| | |
|---|---|
| PATENT NO. | : 9,121,092 B2 |
| APPLICATION NO. | : 13/389091 |
| DATED | : September 1, 2015 |
| INVENTOR(S) | : Astrid Geis |

It is certified that error appears in the above-identified patent and that said Letters Patent is hereby corrected as shown below:

In the specification,

Column 4, line 60, please replace "2 Funcional" with -- 3 Functional --

Column 4, line 61, please replace "3 Corrosion" with -- 5 Corrosion --

Signed and Sealed this
Fifteenth Day of March, 2016

Michelle K. Lee
*Director of the United States Patent and Trademark Office*